United States Patent [19]

Frohlich

[11] Patent Number: 4,471,298

[45] Date of Patent: Sep. 11, 1984

[54] APPARATUS FOR AUTOMATICALLY ELECTRICALLY TESTING PRINTED CIRCUIT BOARDS

[75] Inventor: Sigurd Frohlich, Santa Barbara, Calif.

[73] Assignee: Cirdyne, Inc., Irvine, Calif.

[21] Appl. No.: 329,688

[22] Filed: Dec. 11, 1981

[51] Int. Cl.³ .................... G01R 31/02; G01R 1/073
[52] U.S. Cl. .................... 324/73 PC; 324/73 AT; 324/158 F; 324/158 P
[58] Field of Search ........... 324/73 R, 73 AT, 73 PC, 324/158 F, 158 P, 66, 51, 52

[56] References Cited

U.S. PATENT DOCUMENTS 3,848,188 11/1974 Ardezzone et al. ............ 324/73 AT
3,992,663 11/1976 Seddick ..................... 324/73 PC X
4,227,149 10/1980 Faure et al. ................. 324/158 F X
4,362,991 12/1982 Carbine ..................... 324/158 F X

FOREIGN PATENT DOCUMENTS 746967 7/1980 U.S.S.R. ..................... 324/158 F

OTHER PUBLICATIONS

Boehringer et al., "Electrical Probe Control", IBM Technical Disclosure Bulletin, vol. 13, No. 6, Nov. 1970, p. 1534.

Primary Examiner—Gerard R. Strecker
Attorney, Agent, or Firm—Spensley Horn Jubas & Lubitz

[57] ABSTRACT

An apparatus for automatically testing printed circuit boards on which the test points are locatable at row and column intersections of a grid is described. The apparatus has two bars mounted above the printed circuit board in parallel alignment with the columns of the possible test points. Each bar has a set of probe contacts depending therefrom which can be placed into contact with the test points on the printed circuit board located along a single column. The bars are movable relative to the printed circuit board and may be sequentially placed into contact with any selected pair of columns of possible test points. Test voltages are sequentially applied to selected pairs of the probe contacts, enabling the electrical characteristics between the pairs of test points on the printed circuit board to be measured. A micro-processor is used to control the testing sequence and in correlating the results.

25 Claims, 5 Drawing Figures

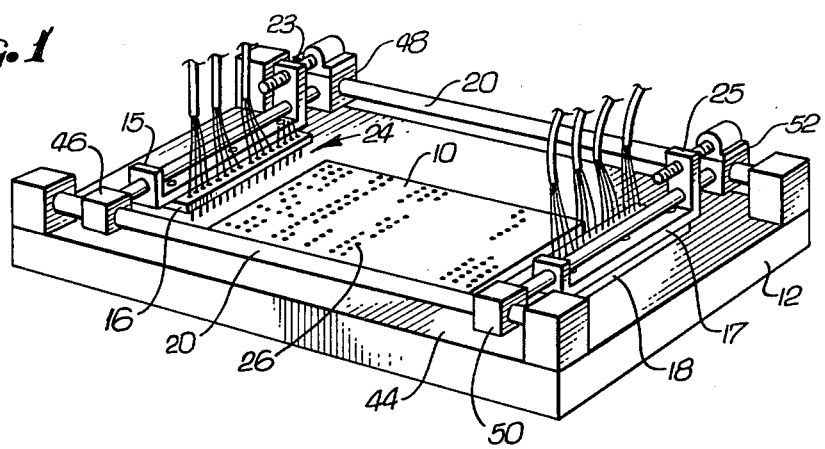
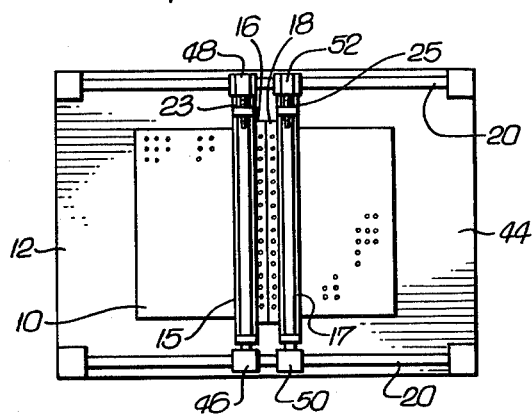
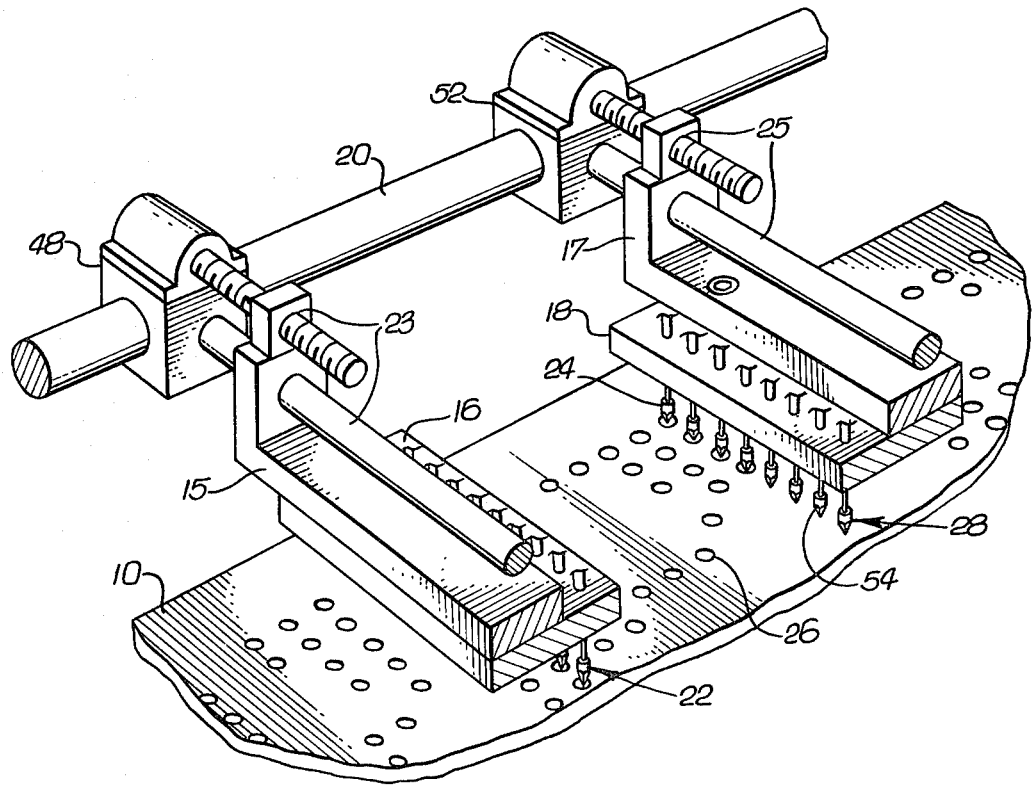

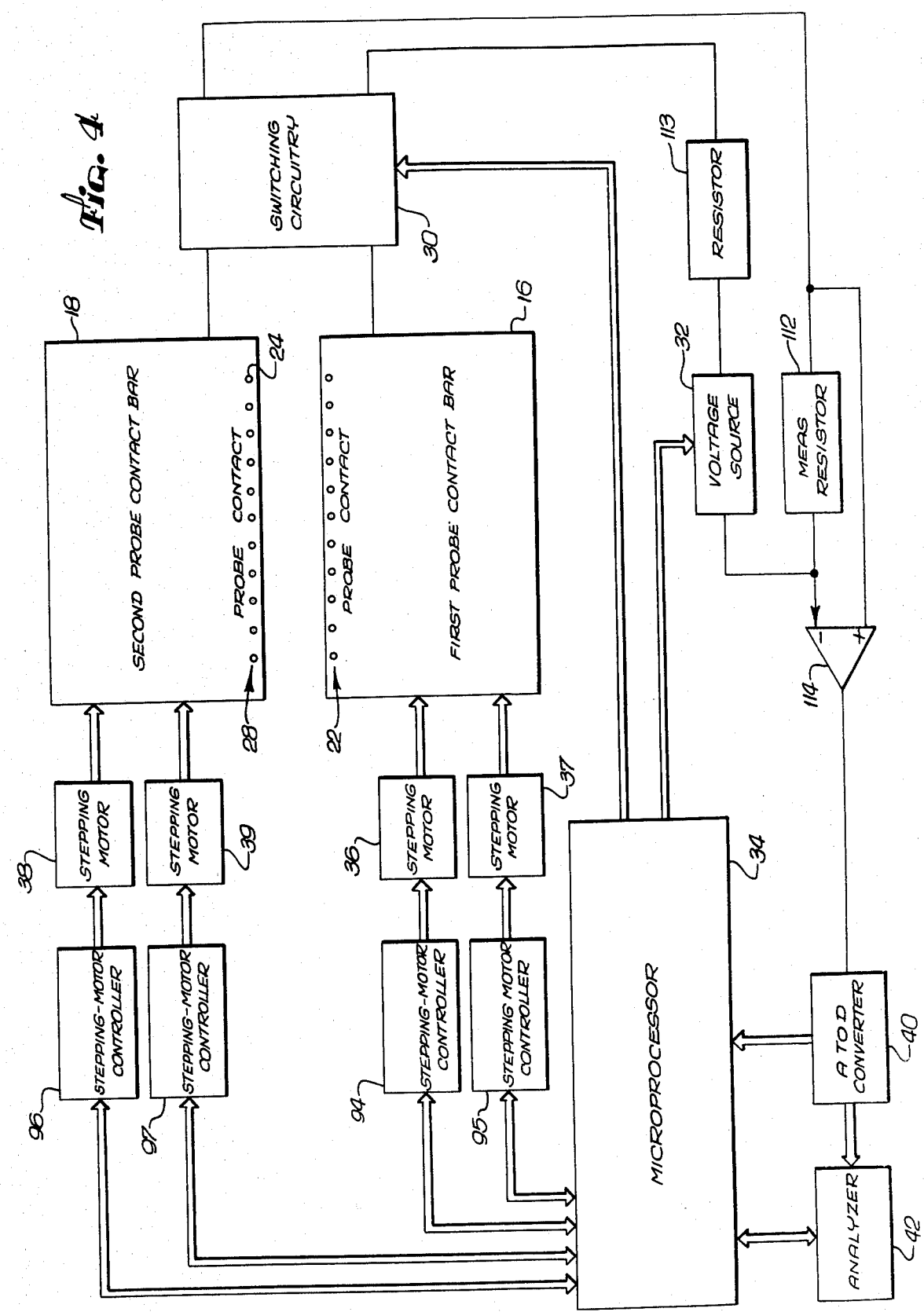

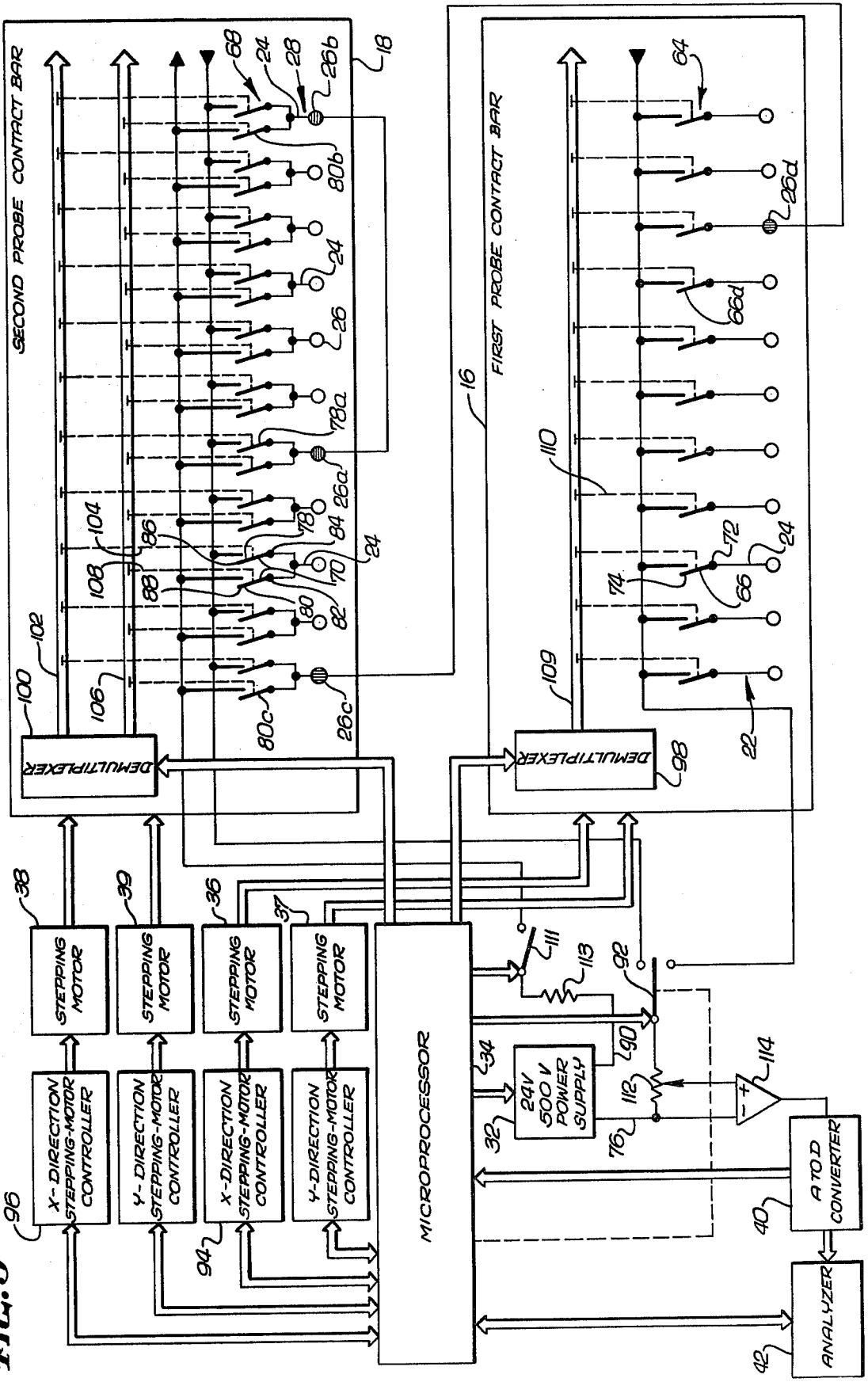

APPARATUS FOR AUTOMATICALLY ELECTRICALLY TESTING PRINTED CIRCUIT BOARDS

BACKGROUND OF THE INVENTION:

1. Field of the Invention:

This invention relates to the field of machines and methods for testing the electrical characteristics of printed circuit boards, the test points of which are regularly disposed on the surface of the board.

2. Prior Art:

Recent trends in the electronics industry point towards ever-increasing microminiturization in both components and packaging. Electronic functions that a few years ago were performed by an entire printed circuit board are now performed by a small chip so that entire systems are now packaged on a single printed circuit board. This trend toward increased circuit densities has had an impact on printed circuit board technology and has introduced new and different problems in their use.

Whereas visual inspection of a single or double sided printed circuit board was possible, the trend towards the use of dense multilayer printed circuit boards consisting of many layers of circuitry sandwiched between layers of nonconducting material make visual inspection impossible or at least highly ineffective. Compounding the problem, the complexity of multilayer printed circuit boards has resulted in increasing the rate of defective bare printed circuit boards produced from levels of less than 1 percent which were typically obtained with single sided, low density printed circuit boards to levels of ten to twenty percent or more on some highly complex multilayer boards.

Concomitantly, the use of large, dense multilayer printed circuit boards with increased numbers of components have caused the monetary value of a loaded printed circuit board to greatly increase, so that the costs associated with scrapping or salvaging the components from a defective printed circuit board have become of major concern to users. Whereas before it was economically feasible to not test bare printed circuit boards and test only the loaded printed circuit boards, this alternative is no longer available in many instances, due not only to the increased costs associated with defective loaded printed circuit boards but to the equipment and skilled labor required to functionally test such loaded boards. Therefore, it is highly desirable that printed circuit boards be tested prior to the insertion and connection of components, and efforts by equipment manufacturers have been directed towards this objective.

The electrical characteristics of bare printed circuit boards may be tested by applying voltages or signals to various sets of conductive pads, members or holes ("conductive pads") disposed on the surface of the printed circuit board to which the components are to be attached. These conductive pads may be connected to conductors located at the various layers in a multilayer printed circuit board and are usually disposed in columns and rows on a regular grid pattern, although they do not usually appear at all possible locations on the grid pattern. It is not unusual for there to be as many as 10,000 different conductive members disposed on the printed circuit board.

Typically, each printed circuit board is tested for the proper continuities between pairs of conductive pads or test points disposed on the surface. Thus, for example, it may be known that two test points should be connected by a conductive strip or printed wire located in a certain interior layer of the board. A voltage may, therefore, be applied to these two test points and if no current flows between them, a defect in the conductive strip between the two test points is indicated. Similarly, a test voltage may be applied to every other pair of test points located on the surface of the printed circuit board to completely test the printed circuit board for continuities and discontinuities. Other tests such as for resistance, conductivity, or insulation, might also be performed.

It will readily be appreciated that because of the great number of individual test measurements that must be made even on one printed circuit board, it is desirable, if not necessary, to have a machine perform the tests and automatically indicate whether a particular printed circuit board is defective or not. The machines previously developed to test printed circuit boards, however, suffer from a number of serious drawbacks.

The prior art machines and methods use a fixture or an adapter plate into which are mounted tiny conducting pins, or probe contacts in a pattern corresponding to that of the test points disposed on the surface of the printed circuit board to be tested. A connector must be fabricated for the test fixture to connect the test pins to the test electronics. The printed circuit board and the fixture are brought into contact, with each test point on the printed circuit board being contacted by a respective pin or probe contact on the fixture. The electrical tests are then conducted by applying voltages to the various probe contacts and comparing the results to the desired results to determine whether the printed circuit board is or is not defective.

The main drawback to the use of the prior art machines and methods is that each different design of printed circuit board to be tested requires that a new test fixture be fabricated to form an array of test pins corresponding to the test points on the particular printed circuit board. In addition, each test pin of the fixture must be individually wired to the test electronics or otherwise connected for use with the test electronics. The cost involved in fabricating and wiring a test fixture for any particular design of printed circuit board is prohibitive where only a few printed circuit boards of a certain design are to be tested. Hence this method of testing printed circuit boards can not feasibly be employed where the number of boards of any one design to be tested is small.

SUMMARY OF THE INVENTION

The present invention relates to a machine and method for testing the electrical characteristics of printed circuit boards, especially those which have their conductive pads or test points locatable at the row and column intersections of a grid or otherwise locatable according to predetermined patterns, although it is not limited to use with such boards.

In one form of the invention, two probe contact bars are suspended above a printed circuit board and aligned parallel to columns of test point locations on the printed circuit board. Depending from each bar is a set of test pins whose spacing is equal to the row spacing of the regularly disposed test points on the printed circuit board or a multiple or fraction of such spacing. Each set of test pin contacts is brought into contact with test points located along a column of the printed circuit board. The test pin contacts are connected to a test generator by electronically controlled switching circuitry which applies the test signal from the generator to selected pairs of test points in the two columns over which the two probe contact bars are positioned.

The parallel contact bars are mounted between parallel rails (which rails are aligned in a direction perpendicular to the columns of the board) and are automatically moved along the rails relative to the printed circuit board so that the probe contacts on the respective bars may be sequentially brought into contact with the test points located along pairs of columns of the printed circuit board. Electrical signals from a micro-processor, preferably, are used to control stepping motors in order to automatically position the probe contact bars sequentially over selected pairs of columns of test points and for each such pair of columns to control the switching circuitry connected between the probe contacts and the test generator in order to enable pairs of test points to be tested. With the present invention, therefore, every test point can be tested relative to every other test point on the printed circuit board by sequentially moving the bars into contact with every possible pair of columns of test points and for each such pair of columns, testing each pair of possible test points in those two columns.

It is possible to reduce the number of test positions which the contact bars must be moved to by employing a concentrator circuit overlay which is placed over the board being tested. The concentrator is a two sided printed circuit which on one side has contact pads which are positioned to contact the test point, and which connect to the other side of the board in a manner to reduce the number of columns to be contacted by the contact bars. This is particularly applicable to multilayer boards where the top layer to be tested does not have a higher density of contact points.

Since occasional test points on a printed circuit board may not be disposed on the regular grid pattern characteristic of the board, the probe contact bars, in the preferred embodiment, are capable of small movements along their length, i.e., in a direction transverse to the rails. This allows the probe contacts to be brought into contact with the non-regularly disposed test points, so that they may also be tested. It is also possible where an overlay concentrator is to be employed to utilize such overlay to position the test points on the grid.

If, for example, a continuity test of a printed circuit board is performed with the present invention a measuring resistor is inserted into the test generator circuit and the voltage across this resistor measured as the test voltage is applied to the various pairs of test points. This voltage will be zero if the two test points are not connected by a printed wire or otherwise electrically connected in the printed circuit board. If an insulation test is being performed, the measured voltage drop should not exceed a certain value.

The output signals are converted from analog to digital and processed in an analyzer or a micro-processor. By comparing the responses obtained during these tests with the responses of an ideal board determined from the computer input utilized to make the artwork employed to form the circuit board or from a previously tested known nondefective board, an indication of the condition of the printed circuit board may be automatically obtained. This result may be coupled to printer, CRT or other computer output.

With the present invention not only is it possible to perform automatically the continuity tests typically done on printed circuit boards, but also very high voltage (500 V.) insulation tests necessary for certain military and other uses can be accomplished during the same testing sequence.

The problems associated with prior art machines and methods are overcome by the present invention. Thus, in the present invention, it is only required that the spacing of the probe contacts on the probe contact bars correspond to the row spacing of the test points on the printed circuit board and that these probe contact bars be aligned with columns of test point locations. By proper sequencing of the movement of the bars and the application of voltage to the pairs of probe contacts, every test point can be automatically tested with respect to every other test point. Eliminated is the need to fabricate or wire an adapter plate for each design of printed circuit board to be tested as is required when using the previously known circuit board test machines. In the present invention, the probe contact bars can be permanently wired to the associated electronics. So long as the printed circuit boards to be tested all have a predetermined spacing between rows of possible test point locations, the device of the present invention can, in its simplest embodiment and without any hardware modification, not only test any such printed circuit board (within the size limitation of the machine) but also locate the actual test points. Moreover, even non-regularly disposed test points can be tested by providing a means for laterally moving one or both probe contact bars. With the present invention, the inefficiency resulting from having to make a special fixture for use with only a few printed circuit boards is eliminated and it is now feasible to automatically test such printed circuit boards especially if produced in small quantities. It is therefore one object of the present invention to provide a machine and a method for efficiently testing the electrical characteristics of a printed circuit board without the use of such a special fixture, and thus to provide a machine and method to automatically test printed circuit boards not fabricated in large quantities.

Other advantages over the previously known methods of automatically testing printed circuit boards are available through the use of the present invention. In the use of the present invention, because the probe contacts on each probe contact bar are disposed in an essentially one-dimensional array, the variation in flatness that is of concern at any instant is only that along each column of test points on the printed circuit board rather than that across the entire board in all directions simultaneously and less force is needed in order to ensure contact. Moreover, the probe contact bars, because of their elongated shape, are more able to make up for any variation in the flatness of a printed circuit board by flexing than is an adapter plate. Hence, whereas the previously known machines and methods using an adapter plate or a fixture made the use of spring-loaded pins or probe contacts mandatory in order to ensure electrical contact with the printed circuit board because of the possible variation in flatness of the printed circuit board over the entire board, with the present invention, more dependable fixed probe contacts may possibly be suitable in some applications.

Even if spring-loaded probe contacts are used, with the present invention a far lesser number is required than has been required when adapter plates or fixtures have been used. Moreover, the pins are mounted in the reusable probe contact bars so that the use of higher quality pins and mounting techniques is economically more feasible and a defective pin is more easily discovered by visual inspection.

The present invention, thus, not only makes possible more reliable testing of printed circuit boards, but also provides a significantly more efficient method for the testing of printed circuit boards where different designs are to be tested but the number of printed circuit boards of each design are relatively few in number.

The novel features which are believed to be characteristic of the present invention, both as to its organization and as to its methods of operation, together with further objectives and advantages thereof will be better understood from the following description, considered in connection with the accompanying drawings, in which a presently preferred embodiment of the invention is illustrated by way of example. It is expressly understood, however, that the description of the preferred embodiment and the drawings are for the purpose of illustration and description only, and are not intended as a definition of the limits of the invention.

BRIEF DESCRIPTION OF THE DRAWINGS:

FIG. 1 is a simplified perspective view of part of the present invention in proximity to the printed circuit board to be tested;

FIG. 2 is an overhead view of the part of the present invention shown in FIG. 1 showing the probe contact bars positioned over adjacent columns of test points;

FIG. 3 is a close-up view of part of the present invention particularly showing probe contacts in contact with test points of a printed circuit board;

FIG. 4 is a simplified schematic diagram of the present invention; and

FIG. 5 is a schematic diagram of a preferred embodiment of the present invention showing details of the switching circuitry of a preferred embodiment.

DESCRIPTION OF THE PREFERRED EMBODIMENT:

The present invention will be described in terms of a preferred embodiment with which it is possible to test not only printed circuit boards having all their test points regularly disposed according to a grid pattern, but also those boards which have some test points which may not be so regularly disposed.

Referring first to FIGS. 1 and 3, suspended above the printed circuit board 10 which is positioned on a vacuum table 12 are first and second probe contact bars 16 and 18. First and second probe contact bars 16 and 18 are attached to mounting bars 15 and 17 respectively which are movably mounted on a pair of rails 20 above the surface of the vacuum table 12 on which the printed circuit board 10 is positioned. The first probe contact bar 16 is fabricated of insulating material and has a set 22 of conductive probe contacts 24 which can be placed into contact with test points 26 located along a column on the printed circuit board 10. The second probe contact bar 18 is also fabricated of insulating material and has a similar set 28 of probe contacts 24 which can also be placed into contact with test points 26 located along a column on the printed circuit board 10. Both the first and second mounting bars 15 and 17 are provided with a means, 23 and 25 respectively, for moving them a small amount in the direction perpendicular to the rails 20. For purposes of illustration probe contact bars 16 and 18 are shown containing only a few probe contacts 24. Practical systems using the present invention however may comprise probe contacts spaced 0.100 inches apart or closer.

Referring to the simplified schematic diagram of FIG. 4, switching circuitry 30 connected between the probe contacts 24 and a test voltage source or generator 32 may be controlled by electronic signals originating in a microprocessor 34, thereby enabling pairs of test points 26 (which are in contact with the probe contacts 24) to be tested. Signals from the microprocessor 34 also control stepping motors 36 and 38 which can independently move the first and second mounting bars 15 and 17 and the attached first and second probe contact bars 16 and 18 along the rails 20 in order to align the sets 22 and 28 of probe contacts 24 with columns of possible test points 26. Stepping motors 37 and 39 are also controlled by signals from the microprocessor 34 and in response to those signals move the mounting bars 15 and 17 and the attached probe contact bars 16 and 18 a small mount in directions along their lengths in order to permit the probe contacts to be placed into contact with irregularly located test points 26. By proper sequencing of the signals to the switching circuitry 30 and to the stepping motors 36, 37, 38 and 39, it is possible to apply the test voltage from the generator 32 to every possible pair of test points 26 on the printed circuit board 10. The information acquired by applying the test voltage is converted into digital form by analog to digital converter 40 and then processed. (It is within the scope of the invention to employ digital test signals which would not require an analog to digital converter.) This processing is done, in the preferred 15 embodiment, by an analyzer 42 or in a microprocessor 34 where comparisons with the known or predicted responses of a nondefective printed circuit board are made to determine whether the printed circuit board 10 under test is defective or not. By proper interface with a storage medium, the micro-processor 34 can store the test data if desired. The known or predicted responses can be obtained for storage in the computer memory from the digitized form of the artwork employed to make the circuitry or by employing a perfect board and comparing the test board with a perfect board via the computer or by obtaining data from the perfect board and storing such data in the computer memory.

Referring to FIGS. 1 through 5, a more detailed description of the device of the present invention in a preferred embodiment and its method of operation will be given. In FIGS. 1 and 2, a printed circuit board 10 is shown mounted on a vacuum table 12. A vacuum table 12 contains a flat top surface 44 with small apertures (not shown) therein. A suction force supplied to the vacuum table 12 from beneath creates a pressure differential which tends to hold a printed circuit board 10 or other object placed on the surface 44 over the apertures in a fixed position and flat against the surface 44 of the vacuum table 12. Vacuum tables, being well known in the art, are not further described herein.

The printed circuit board 10 has located on its surface an array of test points 26, all or most of which are typically locatable along the intersections of row and column lines of an imaginary grid on the surface of the printed circuit board 10. Therefore, not every intersection of a row and a column of the imaginary grid will have a test point located thereat. In addition to the regularly located test points, it may be required that the printed circuit board 10 contain some test points that are not located at the row and column intersections of the imaginary grid pattern.

The test points 26 are conductive pads located at positions where components are to be attached to the printed circuit board 10. In the center of each test point 26, therefore, is usually located a hole through the printed circuit board coated with a conducting material in order to accommodate the component leads. The test points 26 may be connected to one another by means of printed wires located on the surface of the printed circuit board 10 or within the board itself if the board is of the multi-layer variety. Because printed circuit boards are well known in the art, they will not be further described herein.

In the preferred embodiment, first and second mounting bars 15 and 17 are situated in parallel alignment above the vacuum table 12. The first and second mounting bars 15 and 17 are each elongated stiffened members, fabricated preferably from steel or other metal. Each of the mounting bars 15 and 17 span the area between the rails 20 of the vacuum table 12 on which the printed circuit board 10 is positioned for testing.

The first mounting bar 15 extends between and is attached to two mounting blocks 46 and 48. The mounting blocks 46 and 48 are adapted to slide along rails 20 which are fixably attached near their ends to the surface 44 of the vacuum table 12 along each side of the area of the vacuum table on which the printed circuit board 10 to be tested is positioned. Mounting block 46 slides along one rail of the pair of rails 20 while mounting block 48 slides along the other rail. The first mounting bar 15, thus, by means of the cooperation between the mounting blocks 46 and 48 and the rails 20, can move over the area of the vacuum table 12 on which the printed circuit board 10 to be tested is positioned for testing. The rails 20, the mounting blocks 46 and 48, and the first mounting bar 15 are fabricated and cooperate so that when the first mounting bar 15 moves over the area of the vacuum table 12 on which the printed circuit board 10 to be tested has been positioned, the first mounting bar 15 remains parallel to surface 44 of the vacuum table 12.

The second mounting bar 17 is similarly extended between, and attached to, two mounting blocks 50 and 52, which, in the preferred embodiment, can also slide along the rails 20. Mounting block 50 slides along one rail of the pair of rails 20 while mounting block 52 slides along the other rail. The rails 20, the mounting blocks 50 and 52, and the second mounting bar 17 are such that the second mounting bar 17 can move over the area on which the printed circuit board 10 to be tested has been placed and remain parallel with the vacuum table 12.

A first probe contact bar 16 fabricated of electrically insulating material is attached to the first mounting bar 15. Fixedly attached to and depending from the first probe contact bar 16 is a set 22 of probe contacts 24 disposed along a straight line. As can be seen in FIG. 3, each probe contact 24 is a small conductive pin, the end or head 54 of which is suitable for making electrical contact with a test point 26 on the printed circuit board 10. The spacing between the individual probe contacts 24, of the set 22 corresponds to the row spacing of possible test points 26 of printed circuit boards 10 to be tested so that if a printed circuit board 10 is positioned on the vacuum table 12 with its columns of test points 26 aligned parallel to the line defined by the set 22 of probe contacts 24, all the test points 26 located along a single column of possible test point locations on the printed circuit board 10 will be contacted by the probe contacts 24. Thus, as the first mounting bar 15 is slid on its mounting blocks 46 and 48 along the rails 20 over the printed circuit board 10, probe contacts 24 of the set 22 successively contact all the regularly disposed test points 26 on the printed circuit board 10.

A second probe contact bar 18, also fabricated of electrically insulating material, is attached to the second mounting bar 17. The set 28 of probe contacts 24 of the second probe contact bar 18 may be similar in construction and in disposition to the set 22 of probe contacts 24 of the first probe contact bar 16 described above. The probe contacts 24 of set 28 thus may successively contact all the test points 26 located in every column of possible test point locations on the printed circuit board 10 as the second mounting bar 17 is slid on mounting blocks 50 and 52 along the rails 20.

The first and second probe contact bars 16 and 18 are fabricated and disposed with respect to one another so that their respective probe contacts may be placed upon adjacent columns of possible test points 26 on the printed circuit board 10, as shown in FIG. 2. Because such columns of test points 26 may be very close together, it is necessary, in the preferred embodiment to position the probe contacts 24 on the respective first and second probe contact bars 16 and 18 very close to those edges of the first and second probe contact bars 16 and 18 which face each other.

Means 23 and 25 are provided in the preferred embodiment for translating the first and second probe contact bars 16 and 18 respectively a small amount in a direction perpendicular to the direction of motion of the bars 15 and 17 along the rails 20. As one example, means 23 and 25, may comprise rails upon which the mounting bars 15 and 17 or the probe contact bars 16 and 18 slide. Means 23 and 25 permit probe contacts 24 to be positioned on test points 26 which are not located at the typical row and column intersections of test point locations on the printed circuit board 10.

The individual probe contacts 24 are spring-loaded. With the spring-loaded type of probe contacts are used, the probe socket is mounted in the probe contact bar 16 or 18 while the head of the probe contact is fitted onto a spring and sleeve arrangement which cooperates with the probe socket in order to allow a small amount of travel by the probe contact head along its length when pressed against probe contact. The construction and operation of spring-loaded probe contacts are well-known in the prior art of printed circuit board testing machines and will not be described in further detail.

The probe contacts 24 shown in FIG. 3 have heads 54 terminating in edges or points which fit into the holes in the center of the test points. This particular head configuration is suitable for use in high voltage testing as it tends to prevent arcing between the probe contact 24 and adjacent probe contacts and test points. Flat or rounded heads on the probe contacts 24, or other shapes may also prove suitable for use with the present invention.

While the first and second probe contact bars 16 and 18 are moved from one column of possible test point locations to another, rather than have the probe contacts 24 slide across the surface of the printed circuit board 10 as they are being repositioned it is desirable to remove the sets 22 and 28 of probe contacts 24 of the first and second probe contact bars 16 and 18 from the surface of the printed circuit board 10. This can be accomplished by any of a variety of methods. For example, according to a presently preferred method, the probe contact bars 16 and 18 are each coupled to their respective mounting bars 15 and 17 through a pneumatic or electrical mechanism (not shown) which, when energized, moves the probe contact bar 16 or 18, or the mounting bar 15 or 17, a small amount in a vertical direction so that the probe contacts 24 are removed from the surface of the printed circuit board 10 while the bars 16 and 18 are moved along the rails 20 into alignment with other columns of test point locations. Alternatively, the portion of the vacuum table 12 between the rails 20 upon which the printed circuit board 10 is positioned may be raised and lowered a small amount by a pneumatic or electrical mechanism.

In the preferred embodiment, the first and second probe contact bars 16 and 18 are each moved independently along the rails 20 by means of precision electrical stepping motors 36 and 38 respectively, which are shown schematically in FIG. 4. High speed stepping motors capable of stepping at the rate of 6,000 steps per second or more are preferred and are capable of precisely positioning the respective probe contact bars along the rails in response to electrical signals originating in microprocessor 34. The use of stepping motors are but one approach that could be used for positioning the probe contact bars along the rails 20. Stepping motors and various methods of deploying them in order to move objects along rails are well known and will not be described further.

Similarly, stepping motors 37 and 39 are used to translate the probe contact bars 16 and 18 or the mounting bars 15 and 17 in a direction along their length and may also be controlled by signals originating in microprocessor 34. Stepping motors 37 and 39 are selected to provide a maximum translation of the probe contact bars 16 and 18 in this direction equal to approximately the separation between adjacent probe contacts 24 in order to enable irregularly disposed test points 26 to be tested. Means other than stepping motors, such as screws, may also be suitably used.

In order to perform the electrical tests on a printed circuit board 10, the various pairs of probe contacts 24 and thus the test points 26 with which those probe contacts 24 are in contact must be energized by a test voltage. In the present invention, the probe contacts 24 are connected by means of switching circuitry 30 to a source or generator 32 of test voltage.

In the schematic of the preferred embodiment shown in FIG. 5, this source or generator 32 of test voltage provides a selected D.C. voltage between 24 and 500 volts for testing between the various test points 26 on the printed circuit board 10. The low D.C. voltages are used for ascertaining the location of the test points on the printed circuit boards, for programming into the microprocessor the characteristics of known good printed circuit boards and for continuity testing. The high D.C. voltages are used for performing insulation and continuity testing between the various pairs of test points.

The function of the switching circuitry 30 is to allow subsets of test points 26, usually pairs, to which the test voltage is to be applied, to be selected and tested. While many arrangements of switching circuitry 30 to allow test voltage to be sequentially applied to selected pairs of probe contacts 24 and hence to the test points 26 are possible, in the preferred embodiment, a set 64 of single reed switches 66, shown schematically in FIG. 5 is used with the set 22 of probe contacts 24 of the first probe contact bar 16 and a set 68 of double reed switches 70 is used with the set 28 of probe contacts 24 of the second probe contact bar 18. Each single reed switch is connected to a different probe contact 24 on the first probe contact bar 16 on one of its sides 72, while on the other side 74, each single reed switch 66 may be closed to connect to a first side 76 of the power supply 32 (through selector switch 92 and 25 ohm variable resistor 112) or left open. The double reed switches 70 used with the set 28 of probe contacts 24 of the second probe contact bar 18 are each connected to a different probe contact 24 of the second probe contact bar 18. As used in the preferred embodiment, each double reed switch 70 is electrically equivalent to first and second switches, 78 and 80, as shown in FIG. 5, in which one side 82 and 84 of each switch in the pair is connected to a probe contact 24. The other side 86 of first switch 78 may be closed to connect to the first side 76 of the power supply 32 through selector switch 92 and 25 ohm variable resistor 112 or left open. Similarly, the other side 88 of second switch 80 may be closed to connect to the second side 90 of the power supply 32 through power switch 111 and the 475 ohm resistor 113.

The selector switch 92 in FIG. 5 selectively connects either the set 64 of single reed switches 66 connected to the first probe contact bar 16 or the first switches 78 of the set 68 of double reed switches 70 connected to the second probe contact bar 18 to the first side 76 of the source or generator 32 of test voltage. Selector switch 92 can, however, be eliminated and its function performed by proper sequencing of the set 64 of single reed switches 66 and the first switches 78 of the set 68 of double reed switches 70.

In the preferred embodiment, the single reed switches 66, the double reed switches 70, the selector switch 92 and the power switch 111 are all controlled by electrical signals originating in the microprocessor 34. By control of these switches, it is possible to apply the test voltage from the power supply 32 to any pair of test points 26, on the printed circuit board 10 contacted by the probe contacts 24 of the second measuring bar 18 or, alternatively, to apply the test voltage to any pair of test points 26, one of which is in contact with a probe contact 24 from the second probe contact bar 18 and the other of which is in contact with a probe contact 24 from the first probe contact bar 16.

For example, to test the functioning of the printed circuit board 10 between test points 26a and 26b of FIG. 5, which are located in a single column on the printed circuit board 10 beneath the second probe contact bar 18, the selector switch 92 is first properly controlled by the microprocessor 34 to connect the first side of the source or generator 32 to the double reed switches 70 used with the second probe contact bar 18. Then the first switch 78 of each double reed switch 70 (i.e., the switch which in the closed position is connected through selector switch 92 and variable resistor 112 to the first side 76 of the source or generator 32 of test voltage) is placed in the open position except for switch 78a which is closed while the second switch 80 of each double reed switch 70 (i.e., the switch which in the closed position is connected through power switch 111 and resistor 113 to the second side of the source or generator 32 of test voltage) is placed in the open position except for switch 80b which is closed. When power switch 111 is closed, voltage is applied to test points 26a and 26b resulting in the flow of current from the source or generator 32 if in fact test points 26a and 26b are connected by a printed wire within the printed circuit board 10. If they are not connected, either by design or because of a defect of the printed circuit board 10, no current will flow. In the case of a high voltage test, current may flow between two test points which are not by design connected if, because of a defect in the board, the breakdown voltage of the board between the test points is exceeded.

Similarly, test points 26 located in two different columns may be tested after positioning the selector switch 92 to connect the first side 76 of the source or generator 32 of test voltage to the set 64 of single reed switches 66 connected to the probe contacts 24 of the first probe contact bar 16. To test the printed circuit board 10 between test point 26c, which is beneath the second probe contact bar 18 and test point 26d, which is located in the column of test points 26 beneath the first probe contact bar 16, the second switch 80 of each double reed switch 70 is opened except for the second switch 80c while the single reed switches 66 connected to the probe contacts 24 of the first probe contact bar 16 are all opened except for the single reed switch 66d which is closed. Thus, current will flow through the power supply circuit if the two test points 26c and 26d are electrically connected whether by design or inadvertently.

The present invention can be used to locate the test points on a known non-defective printed circuit board and to ascertain the continuities between the various pairs of test points. This information is then stored in the microprocessor 34 and used to determine by comparison the condition of other printed circuit boards 10 of the same design. The test points 26 of a printed circuit board 10 can be automatically located with the present invention. A conductive ground plane is placed beneath the printed circuit board 10 and connected on one side to the voltage generator 32. Since in the center of each test point 26 is a hole plated through with cOnductive material (for a component lead), the sequential application of test voltage to the probe contacts 24 of one of the probe contact bars 16 or 18 can indicate the existence of the test points; current will flow only when the probe contacts 24 are in contact with test points 26, the circuit being completed by the plated-through holes of the test points 26. By the probe contact bar 16 or 18 over the printed circuit board 10, placing the probe contacts 24 of the bar into contact with the possible test point locations, and sequentially applying a test voltage to each probe contact for all possible test point locations the actual locations of the test points 26 are learned. This information is stored in the microprocessor 34 so that during printed circuit board testing, only probe contacts 24 in contact with test points 26 are energized with test voltage.

Once the test point locations have been ascertained, the existence of continuities and discontinuities between the various test points can be determined for a known non-defective printed circuit board 10 by use of the present invention and this information stored in microprocessor 34. This information can be later compared with the results of tests on printed circuit boards 10 to determine their condition.

It is possible to test every regularly located test point 26 on the printed circuit board 10 for continuity or discontinuity with respect to every other test point 26 by properly sequencing the movement of the probe contact bars 16 and 18 over the columns of possible test points 26 on the printed circuit board 10 and, for each pair of columns contacted by the probe contact bars 16 and 18, properly controlling the switching circuitry 30. One variation of the great number of methods of properly sequencing the movement of the probe contact bars 16 and 18 in order to test every regularly located test point 26 with respect to every other regularly located test point 26 on the printed circuit board 10 will be described. According to the method described, the first probe contact bar 16 is initially placed to the left of the test points 26 on the printed circuit board 10 while the second probe contact bar 18 may be placed on the first or left-most column of test points 26. With selector switch 92 positioned so that the first side 76 of the source or generator 32 of test voltage is connected to the first switches 78 of the double reed switches 70 on the second probe contact bar 18, the set 68 of double reed switches 70 (first and second switches 78 and 80) may then be controlled so that every test point 26 in the first column is sequentially tested with respect to every other test point 26 in that column in the manner described above with respect to test points 26a and 26b. The second probe contact bar 18 may then be sequentially positioned by the stepping motor 38 over the other columns of test points 26 on the printed circuit board 10 beginning from left to right. For each of these other columns, the first and second switches 78 and 80 are controlled so that every test point 26 in those columns is tested with respect to every other test point 26 before the second probe contact bar 18 is moved to another column.

After all the test points have been tested with respect to every other test point 26 in the same column, the selector switch 92 is positioned so that the first side 76 of the source or generator 32 is now connected to the set 64 of single reed switches 66 for the first probe contact bar 16 rather than to the set 68 of double reed switches 70 for the second probe contact bar 18. Stepping motor 38 returns the second probe contact bar 18 to the left hand side of the printed circuit board 10 where its probe contacts 24 are placed into contact with the test points 26 located along the second column of possible test points 26 on the printed circuit board 10. At approximately the same time, the first probe contact bar 16 is positioned by stepping motor 36 over the first column of test points 26 on the printed circuit board 10 and its probe contacts 24 placed into contact with the test points 26 located in that column. With the first and second probe contact bars 16 and 18 in these positions, every test point 26 in the first or leftmost column of possible test points 26 is tested with respect to every test point 26 in the second column of possible test points 26 in the manner described above with respect to test points 26c and 26d. Thereafter, the stepping motor 38 may position the second probe contact bar 18 sequentially over the third and succeeding columns to the right. The probe contacts 24 of the second probe contact bar 18 may be successively brought into contact with the test points 26 in those columns and the set 64 of single reed switches 66 and the set 68 of double reed switches 70 controlled so that every test point 26 in the first column is tested with respect to every test point 26 in the column of test points 26 over which the second probe contact bar 18 is successively positioned. By in this manner scanning the second probe contact bar 18 over the columns of test points 26, the first column of test points 26 is tested with respect to every other test point 26 on the printed circuit board 10.

At this point, the second probe contact bar 18 returns toward the left hand side of the printed circuit board 10 and is positioned over the third column of test points 26 on the printed circuit board 10. At approximately the same time, the first probe contact bar 16 is positioned over the second column of possible test points 26 and the probe contacts 24 of the first probe contact bar 16 placed in contact with them. The test points 26 in the second column can then be tested with respect to the test points 26 of the third column and thereafter the second probe contact bar 18 may be sequentially positioned over every other column of test points 26 proceeding from left to right and the test points 26 of the second column therefore tested with respect to the test points 26 in the other columns by properly controlling the set 64 of single reed switches 66 and the set 68 of double reed switches 70 in the manner previously described. (The second column of possible test points 26 on the printed circuit board 10 has been previously tested with respect to the first column of possible test points 26 when the first probe contact bar 16 was positioned over the first column of test points 26 and the second probe contact bar 18 was positioned over the second column of possible test points 26.)

In a similar manner, the first probe contact bar 16 again can be moved to the right one column and positioned on the test points 26 in that column while the second probe contact bar can scan the remaining columns of test points on the printed circuit board 10 located to the right of the first probe contact bar 16, and for each pair of columns the sequential electrical testing of the test points 26 can be accomplished by proper control of the set 64 of single reed switches 66 and the set 68 of double reed switches 70. This simple procedure can be continued until the first probe contact bar 16 and the second probe contact bar 18 are placed respectively on the test points 26 in the second to last and last column of possible test points 26 on the printed circuit board 10. After the sequential electrical testing has been accomplished on those test points 26, every possible test point 26 will have been tested with respect to every other possible test point 26 on the printed circuit board 10.

With the preferred embodiment of the present invention, non-regularly disposed test points 26 may be accomodated and tested with respect to other test points 26. A probe contact 24 of either the first or second probe contact bar 16 or 18 may be placed into contact with each such test point 26 so that it may be tested with respect to every other test point 26. The means 23 and 25 controlled by the stepping motors 37 and 39 respectively allows these non-regularly disposed test points 26 to be contacted.

The above-described procedure for testing every test point 26 on the printed circuit board 10 with respect to every other test point 26 is done automatically. Both the signals which control the switching circuitry 30 and the signals which control the stepping motors 36, 37, 33 and 39 and thereby control the positions of the first and second probe contact bars 16 and 18 originate from a program control unit. In the preferred embodiment, the program control unit is a microprocessor 34. The microprocessor 34 provides control signals to the four stepping motor controllers 94, 95, 96 and 97 for the stepping motors 36, 37, 38 and 39 respectively. In response to these control signals, the stepping motor controllers 94 and 96 provide the correct voltages to the stepping motors 36 and 38 respectively in order to position the first and second probe contact bars 16 and 18 at the desired positions along the rails 20. Similarly, stepping motor controllers 95 and 97 provide the correct voltages to the stepping motor 37 and 39 respectively, in order to position the probe contact bar 16 and 18 over non-regularly disposed test points 26. Such stepping motor controllers are well known in the art and will not be further described.

Other signals from the microprocessor 34 are used to control the sequential application of the test voltage to the various pairs of probe contacts 24 on the first and second probe contact bars 16 and 18 and thus to the test points 26. This is accomplished in the preferred embodiment, by electronically controlling the selector switch 92, the set 64 of single reed switches 66 connected to the the probe contacts 24 of the first probe contact bar 16 and the set 68 of double reed switches 70 connected to the probe contacts 24 of the second probe contact bar 18. In order to interface control signals from the microprocessor 34 with the multiple control inputs to the set 64 of single reed switches 66 and the set 68 of double reed switches 70, demultiplexers 98 and 100 are used in the preferred embodiment. Demultiplexers which apply signals to selected separate output leads depending on the input signals from control units such as microprocessors are well known in the art and their construction and operation will not be further described.

A double demultiplexer 100 is used in connection with the set 68 of double reed switches 70. This demultiplexer 100 has two series of outputs for the set 68 of double reed switches 70; one series of outputs 102 is attached one to one to the control inputs 104 of the first switches 78 of the double reed switches 70 and the second series of outputs 106 is attached one to one to the control inputs 108 to the second switches 80 of the double reed switches 70. To control the set 64 of single reed switches 66 connected to the probe contacts 24 of the first probe contact bar 16, a demultiplexer 98 with a single series of outputs 109 is used. This series of outputs 109 is attached one to one to the control inputs 110 of the single reed switches 66. The microprocessor 34 is therefore programmed to provide outputs to the two demultiplexers 98 and 100 and to the four stepping motor controllers 94, 95, 96 and 97 so that every test point 26 on the printed circuit board 10 can be tested with respect to every other test point 26 according to the procedure described above.

In the preferred embodiment, a measuring resistor 112 is inserted in series with the source or generator 32 of test voltage and an output signal is taken across this resistor 112 into a differential amplifier 114. If no current flows through the test generator circuit because the pair of test points 26 being tested is not electrically connected, there will be no voltage drop across the resistor 112 and hence no signal into or out of the differential amplifier 114. If, however, the pair of test points 26 under test is electrically connected, there will be a voltage drop across the resistor 112 and hence an input into and an output from the differential amplifier 114.

The present invention is useful for performing high voltage tests on printed circuit boards 10. A high voltage, such as 500 volts may be applied to the various pairs of test points 26 which are in contact with the probe contacts 24 of the first or second probe contact bars 16 or 18. So long as test points 26 are not connected, no current will flow. If, however, there is continuity between a pair of test points 26, current will flow and the voltage across the printed circuit board 10 will drop from 500 volts to millivolts at 1 amp. To handle this current flow the present invention uses sets 64 and 68 of reed switches.

There are many well known techniques for analyzing the data resulting from the sequential application of test voltages to the various pairs of test points 26 on the printed circuit board 10. The signal analysis techniques employed in the prior art machines are applicable to the present invention. In the preferred embodiment, an output signal from the differential amplifier 114 is directed into an analog to digital converter 40. It is then compared in an analyzer 42 with a signal originating from a microprocessor 34, this signal corresponding to the expected signal from the test of the particular pair of test points 26 being tested. A visual or printed indication may be given if the comparison indicates that there is a defect in the printed circuit board 10. Alternatively the digitized output signal from the analog to digital converter 40 may be applied to the input of the microprocessor 34 and there compared with stored signals representing the expected output signals from a printed circuit board 10 containing no defects. In either case, the microprocessor 34 may be interfaced with disc or other storage means so that the data may be stored for future use or in the event of a power failure. The microprocessor 34 may either be pre-programmed with the predicted response of a defect-free printed circuit board or a known defect-free printed circuit board may be placed in the circuit board test machine and its response stored for use as a basis against which to compare the response of other printed circuit boards tested. The many and various means of analyzing the data resulting from the test of a printed circuit board and of comparing such data to the expected response of a defect-free printed circuit board are well known in the art and are not further explained.

While the presently preferred embodiment has been described with respect to a specific configuration, there are many other configurations and variations that are of course within the scope of the present invention. For example, if the test points 26 on the printed circuit board 10 are disposed on a regular pattern which is not a grid, the probe contacts 24 on the probe contact bars 16 and 18 can be spaced according to the repeating nature of the pattern.

Similarly, it may be desirable to position two rows of probe contacts 24 on one of the probe contact bars. This would allow two adjacent columns of test points 26 to be tested with respect to one another by voltage applied sequentially to pairs of probe contacts 24 in the two adjacent columns located on the same probe contact bar. The necessity of having to position the two probe contact bars immediately adjacent to one another during testing in order to test adjacent columns of test points is thus eliminated. The probe contacts thus could be positioned slightly further from the edges of the probe contact bars then they could be if the probe contact bars had to be placed on adjacent columns of test points.

In other configurations, the present invention could use more than two probe contact bars if it were desired to simultaneously test more than two test points all located in different columns of possible test point locations on the printed circuit board.

It is also within the scope of the present invention to deploy two or more probe contact bars in a non-parallel configuration. For example, one probe contact bar might be at right angles to the others. In such a case, more complex probe contact bar positioning techniques, such as two dimensional translation stages could be used.

Consistent with the subject invention is the use of an overlay two sided printed circuit member to reduce the number of positions which the contact bar must move to. Such an overlay may also be employed to move off grid test points to an on grid position. The overlay is simply an insulator material with printed circuitry on each side and vices interconnecting the two sides. The printed circuitry on one side would have contact pads coinciding with the test points on top layer of the multilayer board being tested. From the contact pad circuit lines would be formed to a dense matrix vices which would pass through insulator material to the other side to connect with a dense arrangement of test pads to be contacted by the test probes of the machine. In this manner the test positions to be assumed by the contact bars can be substantially reduced. The same technique and overlay construction can be employed to move off grid test points to a grid position. Both functions may be accomplished by the same overlay.

It is also useful with respect to testing boards to place a transparent or other thin protective sheet member over the board being tested. This protective sheet member would have holes drilled in it at all of the test points which would expose such points for testing. The holes drilled in the sheet member would be of a size to prevent any possibility of a single test probe contacting two test points simultaneously. The protective sheet member also enables the contact bars to move over the board being tested without any possibility of damage to the board.

Although a particular embodiment of the invention has been described and illustrated herein, it is recognized that many modifications and variations not discussed herein may readily occur to those skilled in the art and consequently it is intended that the claims be interpreted to cover such modifications and equivalents.

I claim:

1. An apparatus for automatically electrically testing a printed circuit board on which test points are locatable at row and column intersections of a grid, said printed circuit board being mounted on a table comprising:

first and second separate probe contact bars mounted above said table in parallel alignment with each other and with columns of said grid, and each having a set of probe contacts depending therefrom, said contacts being spaced along said columns in accordance with the row spacing of said grid for contact with said test points;

bar positioning means for separately, independently positioning said first and second separate probe contact bars relative to said table to independently selectable grid column aligned positions above said printed circuit board with respective seats of probe contacts in electrical connection with test points in said respective pair of grid columns, said bar positioning means initially positioning said first and second separate probe contact bars into alignment with a selectable first pair of columns in said grid; and test program control means for causing the sequential electrical testing of said printed circuit board between selected subsets of said probe contacts, and for thereafter directing said bar positioning means to reposition at least one of said separate probe contact bars into alignment with a different pair of columns of said grid and for causing the sequential electrical testing of said printed circuit board between selected subsets of probe contacts with said at least one probe contact bar in said new position.

2. An apparatus as in claim 1 wherein said test program control means includes a means for directing said bar positioning means to sequentially reposition said first and second probe contact bars into alignment with other selected pairs of columns in said grid and for each said selected pair of columns, for causing the sequential electrical testing of said printed circuit board between selected subsets of said probe contacts.

3. An apparatus as in claim 1 wherein said selected subsets of probe contacts are pairs.

4. An apparatus as in claim 1 wherein said test program control means includes
a test voltage source to be used to test subsets of probe contacts; and
switching circuitry connected to said test voltage source and to said probe contacts to sequentially apply voltage from said test voltage source to selected subsets of probe contacts.

5. An apparatus as in claim 4 wherein said test program control means includes sequencing means coupled to said switching circuitry and to said bar positioning means for directing said bar positioning means to sequentially position said first and second probe contact bars into alignment with selected pairs of columns in said grid and, for each said selected pair of columns, for directing said switching circuitry to sequentially apply voltage from said generator to selected subsets of probe contacts.

6. An apparatus as in claim 1 wherein said test program control means includes
a test voltage source to be used to test pairs of test points;
a set of double reed switches connected to said test voltage source, one such double reed switch connected to each said probe contact depending from said first probe contact bar, said set of double reed switches enabling voltage from said test voltage source to be selectively applied to any pair of probe contacts depending from said first probe contact bar;
a set of single reed switches, connected to said test voltage source, one such switch connected to each said probe contact depending from said second probe contact bar, said set of single reed switches, in cooperation with said set of double reed switches, enabling voltage from said test voltage source to be selectively applied to any pair of probe contacts, one of which pair depends from said first probe contact bar and the other of which depends from said second probe contact bar;
sequencing means coupled to said set of single reed switches, to said set of double reed switches and to said bar positioning means for directing said bar positioning means to sequentially position said first and second probe contact bars into alignment with selected pairs of columns in said grid and, for each said selected pair of columns, for directing said sets of switches so as to enable voltage from said test voltage source to be sequentially applied to selected pairs of probe contacts.

7. An apparatus as in claim 1 wherein said test program control means includes:
a first set of relay switches, equal in number to the probe contacts depending from said first probe contact bar, each such relay switch being connected at one side to a different probe contact depending from said first probe contact bar;
a second set of relay switches equal in number to the number of probe contacts depending from said first probe contact bar, each such relay switch being connected at one side to a different probe contact depending from said first probe contact bar;
a third set of relay switches equal in number to the number of probe contacts depending from said second probe contact bar, each such relay switch being connected at one side to a different probe contact from said second probe contact bar; and
a test voltage source to be used to test pairs of test points; said voltage source being capable of being connected across said first set of relay switches and said second set of relay switches and across said first set of relay switches and said third set of relay switches;
whereby voltage from said test voltage source may be selectively applied to any pair of probe contacts, at least one of which probe contacts depends from said first probe contact bar.

8. An apparatus according to claim 7 wherein said test program control means includes sequencing means coupled to said bar positioning means for directing said bar positioning means to sequentially position said first and second probe contact bars into alignment with selected pairs of columns in said grid and, for each selected pair of columns, for directing said sets of switches to sequentially apply voltage from said test voltage source to selected pairs of probe contacts, said pairs including at least one probe contact depending from said first probe contact bar.

9. An apparatus as in claim 1 wherein said bar positioning means comprises:
at least one rail in parallel alignment with rows of said grid upon which at least one said probe contact bar is movably mounted; and
driving means for moving said probe contact bar along said at least one rail.

10. An apparatus as in claim 9 wherein said driving means includes at least one electric motor.

11. An apparatus according to claim 5 wherein said sequencing means is electrically coupled to said bar positioning means and said switching circuitry.

12. An apparatus according to claim 5 wherein said sequencing means comprises a specially programmed computer having outputs electrically coupled to said switching circuitry and to said bar positioning means.

13. An apparatus according to claim 1 in which said bar positioning means is controllable by electrical signals.

14. An apparatus according to claim 4 wherein said switching circuitry is controllable by electrical signals.

15. An apparatus according to claim 5 wherein said sets of relay switches are controllable by electrical signals.

16. An apparatus according to claim 5 in which said bar positioning means and said switching circuitry are controllable by electrical signals and said sequencing means is a specially programmed computer electrically controlling said bar positioning means and said switching circuitry.

17. An apparatus according to claim 8 wherein said sequencing means comprises a specially programmed computer having outputs electrically coupled to said sets of relay switches for controlling said relay switches and to said bar positioning means for controlling the position of said probe contact bars.

18. An apparatus as in claims 1 or 2 further comprising a means for positioning at least one of said probe contact bars so that a said probe contact of said probe contact bar may be placed into electrical connection with a test point on said printed circuit board not locatable at a row and column intersection of said grid.

19. A method for automatically electrically testing a printed circuit board mounted on a table on which test points are locatable at row and column intersections of a grid comprising:
  automatically positioning a first probe contact bar having a set of probe contacts depending therefrom and spaced in accordance with the row spacing of said grid so that said probe contacts contact said test points located along a first grid column;
  automatically positioning independent of said first probe contact bar a second probe contact bar having a set of probe contacts depending therefrom and spaced in accordance with the row spacing of said grid so that said contacts contact said test points located along a second grid column;
  thereafter sequentially electrically testing said printed circuit board between selected pairs of test points in said first and second columns by sequentially applying test voltage automatically to pairs of probe contacts in contact with said pairs of test points;
  thereafter automatically repositioning said first probe contact bar so that said probe contacts depending therefrom contact the test points located along a different grid column while said second probe contact bar remains stationary; and
  thereafter sequentially electrically testing said printed circuit board between selected pairs of test points in said columns contacted by said probe contacts depending from said first and second probe contact bars by sequentially applying test voltage automatically to pairs of probe contacts in contact with said pairs of test points.

20. An apparatus for automatically electrically testing a printed circuit board on which test points are locatable at least in part in a predetermined pattern, said printed circuit board being mounted on a table, comprising:
  elongated separate first and second probe contact members mounted above said table to enable at least one of said separate contact members to move over said circuit board independently of the other, each contact member having a set of probe contacts depending therefrom and positioned along said contact member, said contacts being located in accordance with the pattern of said test points so that upon movement of said contact members the probe contacts will contact certain test points on the circuit board;
  positioning means for separately, independently positioning at least one of said contact members relative to said table and to said other contact member to selectable aligned positions with respect to said printed circuit board wherein probe contacts are in electrical connection with test points; and
  test program control means for causing the sequential electrical testing of said printed circuit board between selected subsets of said probe contacts, and for thereafter directing said positioning means to position said contact members into alignment with other test points and for causing the sequential electrical testing of said printed circuit board between selected subsets of probe contacts with said at least one probe contact member in said new position.

21. An apparatus as in claim 1 wherein said test program control means is a means which, after causing the sequential electrical testing of said printed circuit board between selected subsets of said probe contacts, directs said bar positioning means to reposition one of said separate probe contact bars into alignment with a different column of said grid while said other separate probe contact bar is maintained stationary.

22. An apparatus as in claim 1 wherein said test program control means is a means which, after causing the sequential electrical testing of said printed circuit board between selected subsets of said probe contacts, directs said bar positioning means to separately reposition both said first and second separate probe contact bars relative to said table into alignment with a different pair of columns of said grid.

23. An apparatus as in claim 1 wherein said sets of probe contacts on said first and second separate probe contact bars each span the entire distance across a printed circuit board mounted on said table at which test points are locatable in grid columns.

24. A method as in claim 19 further comprising:
  thereafter automatically idependently repositioning both said first and second probe contact bars so that said probe contacts depending therefrom contact the test points located in a different pair of grid columns; and
  thereafter sequentially electrically testing said printed circuit between selected pairs of test points in said columns contacted by said probe contacts depending from said independently automatically repositioned said first and second probe contact bars by sequentially applying test voltage automatically to pairs of probe contacts in contact with said pairs of test points.

25. An apparatus as in claim 20 wherein said elongated separate first and second probe contact members each have a set of probe contacts which span a printed circuit board mounted on said table.

* * * * *